(12) United States Patent
Jain et al.

(10) Patent No.: US 12,170,313 B2
(45) Date of Patent: Dec. 17, 2024

(54) HETEROJUNCTION BIPOLAR TRANSISTOR WITH BURIED TRAP RICH ISOLATION REGION

(71) Applicant: GLOBALFOUNDRIES U.S. Inc., Malta, NY (US)

(72) Inventors: Vibhor Jain, Williston, VT (US); Anthony K. Stamper, Burlington, VT (US); John J. Ellis-Monaghan, Grand Isle, VT (US); Steven M. Shank, Jericho, VT (US); Rajendran Krishnasamy, Essex Junction, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/324,637

(22) Filed: May 26, 2023

(65) Prior Publication Data
US 2023/0299132 A1 Sep. 21, 2023

Related U.S. Application Data

(62) Division of application No. 17/074,891, filed on Oct. 20, 2020, now Pat. No. 11,721,719.

(51) Int. Cl.
*H01L 29/06* (2006.01)
*H01L 21/763* (2006.01)
*H01L 29/08* (2006.01)
*H01L 29/165* (2006.01)
(Continued)

(52) U.S. Cl.
CPC ........ *H01L 29/0642* (2013.01); *H01L 21/763* (2013.01); *H01L 29/0826* (2013.01); *H01L 29/165* (2013.01); *H01L 29/66242* (2013.01); *H01L 29/7371* (2013.01)

(58) Field of Classification Search
CPC ............. H01L 29/0642; H01L 29/0826; H01L 29/165; H01L 29/66242; H01L 29/7371; H01L 29/0821; H01L 29/737; H01L 29/78; H01L 21/763; H01L 21/823481; H01L 21/8249; H01L 21/76283; H01L 27/0623; H01L 27/0635; H01L 23/481; H01L 23/485
See application file for complete search history.

(56) References Cited

U.S. PATENT DOCUMENTS

| 5,723,896 A | 3/1998 | Yee et al. |
| 6,767,797 B2 | 7/2004 | Krutsick |
| 7,476,914 B2 | 1/2009 | Dokumaci et al. |

(Continued)

OTHER PUBLICATIONS

Babcock et al. "Advantages of SiGe-pnp over Si-pnp for analog and RF enhanced CBiCMOS and Complementary Bipolar design usage", IEEE, 2016, 10 pages.

*Primary Examiner* — Calvin Y Choi
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to heterojunction bipolar transistors (HBTs) with a buried trap rich region and methods of manufacture. The structure includes: a trap rich isolation region embedded within the bulk substrate; and a heterojunction bipolar transistor above the trap rich isolation region, with its sub-collector region separated by the trap rich isolation region by a layer of the bulk substrate.

20 Claims, 6 Drawing Sheets

(51) Int. Cl.
*H01L 29/66* (2006.01)
*H01L 29/737* (2006.01)

(56) References Cited

U.S. PATENT DOCUMENTS

| | | |
|---|---|---|
| 7,846,805 B2 | 12/2010 | Zhang et al. |
| 7,855,404 B2 | 12/2010 | Heinemann et al. |
| 7,880,270 B2 * | 2/2011 | Heinemann ......... H01L 29/7378 |
| | | 257/586 |
| 7,972,919 B2 | 7/2011 | Gray et al. |
| 8,035,167 B2 | 10/2011 | Knoll et al. |
| 9,640,528 B2 | 5/2017 | Preisler et al. |
| 9,721,969 B2 | 8/2017 | Verma et al. |
| 9,761,700 B2 | 9/2017 | McPartlin |
| 9,941,170 B2 | 4/2018 | Chevalier et al. |
| 10,192,779 B1 | 1/2019 | Shank et al. |
| 10,367,083 B2 | 7/2019 | Jain et al. |
| 10,468,294 B2 | 11/2019 | Peidous et al. |
| 11,158,535 B2 | 10/2021 | Shank et al. |
| 11,315,825 B2 | 4/2022 | Abou-Khalil et al. |
| 2002/0130409 A1 * | 9/2002 | Oue .................. H01L 23/3677 |
| | | 257/E23.105 |
| 2019/0027436 A1 * | 1/2019 | Lum .................. H01L 23/5225 |
| 2019/0080957 A1 | 3/2019 | Peidous et al. |
| 2019/0109055 A1 * | 4/2019 | Preisler ............... H01L 29/0692 |
| 2019/0140072 A1 | 5/2019 | Chevalier et al. |
| 2021/0074551 A1 | 3/2021 | Cheng et al. |
| 2022/0122968 A1 | 4/2022 | Jain |

\* cited by examiner

HETEROJUNCTION BIPOLAR TRANSISTOR WITH BURIED TRAP RICH ISOLATION REGION

FIELD OF THE INVENTION

The present disclosure relates to semiconductor structures and, more particularly, to heterojunction bipolar transistors (HBTs) with a buried trap rich isolation region and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications due to good RF performance, high breakdown voltage and integration with CMOS devices.

Increasing the breakdown voltage of a HBT without degrading hep performance factors is difficult.

SUMMARY

In an aspect of the disclosure, a structure comprises: a trap rich isolation region embedded within the bulk substrate; and a heterojunction bipolar transistor above the trap rich isolation region, with its sub-collector region separated from the trap rich isolation region by a layer of the bulk substrate.

In an aspect of the disclosure, a structure comprises: an isolation region comprising polycrystalline semiconductor material and embedded within a single crystalline substrate; a heterojunction bipolar transistor above the isolation region; and a deep trench isolation structure isolating the heterojunction bipolar transistor and contacting the isolation region.

In an aspect of the disclosure, a structure comprises: a first isolation region comprising polycrystalline semiconductor material, which is embedded within a single crystalline substrate; a second isolation region comprising the polycrystalline semiconductor material, the second isolation region being vertically above and separated by the first isolation region by the single crystalline substrate; a heterojunction bipolar transistor above the first isolation region; a logic transistor isolated from the heterojunction bipolar transistor and also above the first isolation region; and a device isolated from the heterojunction bipolar transistor and the logic transistor, the device being above the first isolation region and the second isolation region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors with a buried trap rich isolation region and methods of manufacture. More specifically, the present disclosure relates to a SiGe heterojunction bipolar transistor (HBT) with a buried trap rich isolation region under and separated from its sub-collector region. Advantageously, the buried trap rich isolation region lowers the collector to sub-collector capacitance (Ccs) while also reducing substrate leakage and providing improved device-to-device isolation. Moreover, the buried trap rich region enables smaller form factor chips (thinner chips).

In embodiments, the SiGe HBT is provided on a bulk wafer with a trap rich isolation region buried below the sub-collector region. An intrinsic semiconductor layer can be provided between the sub-collector region and the trap rich isolation region such that the sub-collector region does not contact the buried trap rich isolation region. In further embodiments, switches, BEOL passive devices like inductors and low noise amplifiers (LNA) can be provided above multiple buried trap isolation regions; whereas, logic FETs and HBTs are above a single buried trap rich isolation region.

The buried trap rich isolation region can be a trap rich polycrystalline silicon material, formed by an argon implantation process in a handle wafer under a crystalline silicon layer and NPN structure, for example. The buried trap rich isolation region can also be formed by other non-dopant implants as described herein. In simulations, it has been shown that the buried trap rich isolation region provides improved isolation from the substrate, e.g., reduces substrate leakage, device-to-device leakage and Ccs. For example, by using the buried trap rich region, Ccs can be reduced by approximate 27% and substrate leakage can be reduced by a factor of approximately 100×, compared to known SiGe HBT devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
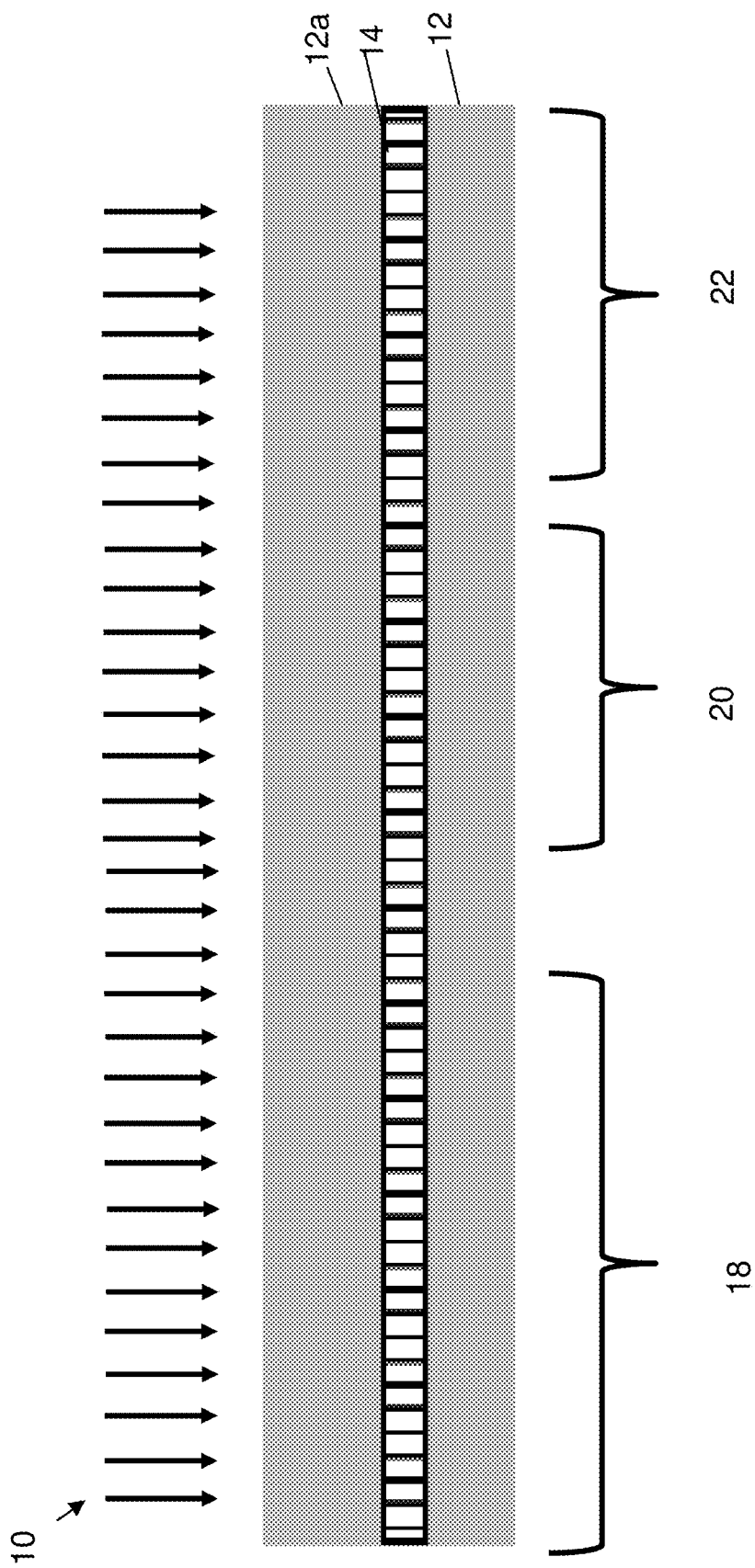
FIG. 1 shows a substrate with a trap rich isolation region (e.g., layer) and respective fabrication processes in accordance with aspects of the present disclosure.

FIG. 1 shows a substrate with a trap rich isolation region (e.g., layer) and respective fabrication processes. More specifically, the structure 10 of FIG. 1 includes a substrate 12 which could have high resistivity (e.g., 100 ohm-cm or greater), a trap rich isolation region 14 and epitaxial substrate material 12a over the trap rich isolation region 14. In embodiments, the trap rich isolation region 14 can be embedded within the substrate 12 and epitaxial substrate material 12a. The substrate 12 and epitaxial substrate material 12a are preferably composed of single crystalline Si material with any suitable crystallographic orientation (e.g., a (100), (110), (111), or (001) crystallographic orientation). The substrate 12 and epitaxial substrate material 12a may also be composed of other bulk, single crystalline semiconductor materials, including but not limited to, Si, SiGe, SiGeC, SiC, GaAs, InAs, InP, and other III/V or II/VI compound semiconductors. For purposes of this discussion, the substrate includes devices in regions 18, 20, 22.

The trap rich isolation region 14 can be a high resistivity region, e.g., higher than the resistivity of the substrate 12, which significantly reduces substrate leakage. For example, the trap rich isolation region 14 can be a polycrystalline silicon layer, with a high resistivity. In embodiments, the trap rich isolation region 14 is formed by a blanket argon implant process; although the use of any non-dopant or noble gas is contemplated herein for the implantation process. By way of illustrative example, the substrate 12 can be subjected to an implant at a dose which will allow recrystallization of any damaged semiconductor material in the regions 18, 20 by a subsequent anneal. More specifically, the substrate 12 can be subjected to an argon implant at 400 KeV and a dose of $1.25 \times 10^{15}$ cm$^{-2}$. By way of further illustrative examples, other implant parameters are contemplated herein depending on the desired thickness and depth of the implant region including, e.g., the ion dose may be less than or greater than $1.25 \times 10^{15}$ cm$^{-2}$ or within a range of $1 \times 10^{13}$ cm$^{-2}$ to $5 \times 10^{16}$ cm$^{-2}$.

As noted already, the thickness of the trap rich isolation region 14 can be adjusted depending on the parameters of the implantation process. For example, the thickness of the trap rich isolation region 14 can be in the range of 50 nm to 2 μm. In more specific embodiments, the thickness of the trap rich isolation region 14 can be 400 nm to 500 nm and, in further embodiments, about 100 nm to 200 nm. In addition, the trap rich isolation region 14 can be provided in specific regions of the substrate 12 such as only under an active area of a device between the deep trench isolation structure(s).

Following the implantation process, an anneal process is performed that recrystallizes the top layer of the trap rich isolation region 14, e.g., polysilicon region 14, into a single crystal region. In particular, the thermal process repairs or heals the damage to (i.e., recrystallize or regrow) the semiconductor material of the modified layer. For example, the anneal may be a rapid thermal anneal (RTA) performed with a peak temperature in a range of 860° C. to 1125° C. with a dwell time at the peak temperature of 34 milliseconds to 60 seconds and, in a particular, the peak temperature may be 1000° C. held for a dwell time of 5 seconds. Then the epitaxial substrate material 12a can be grown by any known epitaxial growth process. In embodiments, the epitaxial material 12a can be grown to a thickness of about 0.5 microns to about 3 microns; although other thicknesses are contemplated herein which maintain device performance, e.g., NPN performance, while still obtaining the benefit of the trap rich isolation region 14. The trap rich isolation region 14 can now embedded within single crystalline semiconductor material of the substrate 12 and epitaxial substrate material 12a.

Figure 2:
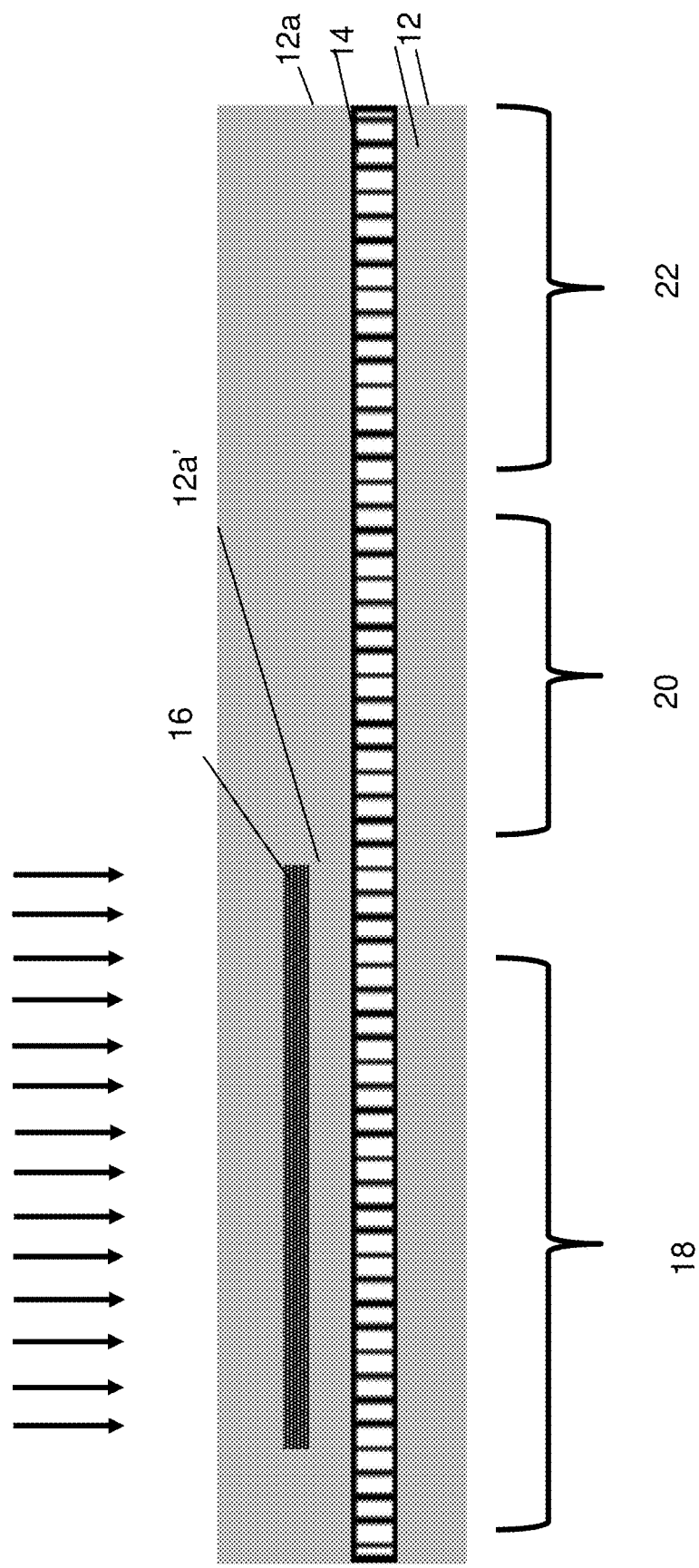
FIG. 2 shows a sub-collector region above the trap rich isolation region, amongst other features, and respective fabrication processes in accordance with aspects of the present disclosure.

In FIG. 2, a sub-collector region 16 is formed within the epitaxial substrate material 12a in a HBT region 18. In embodiments, the sub-collector region 16 can be formed by an implantation process, e.g., using an N-type implant for a HBT NPN device. Depending on the parameters of the implantation process, the sub-collector region 16 could diffuse into the epitaxial substrate material 12a about 0.1-1.0 micron deep in a 2 micron thick epitaxial substrate material 12a, leaving a space 12a' of intrinsic substate material between the sub-collector region 16 and the trap rich isolation region 14. It should be recognized by those of ordinary skill in the art that other spacings 12a' of the sub-collector region 16 from the trap rich isolation region 14 is contemplated herein, e.g., 2 micron spacing. In any of the different scenarios, the sub-collector region 16 can be vertically above and does not contact the trap rich isolation region 14.

In the implantation process for the sub-collector region 16, a patterned implantation mask can be used to define selected areas exposed for the implantation of the sub-collector region 16. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions. The implantation mask used to select the exposed area can be stripped after implantation. Following the implant process, an anneal can be performed to repair the damage from the implant. In embodiments, another epitaxial step can be implemented to grow single crystal silicon such that the sub-collector region 16 is buried within the layer 12a as shown in FIG. 2. This epitaxial step can be 0.1 μm to 2.0 μm in thickness though other thickness are also possible.

Figure 3:
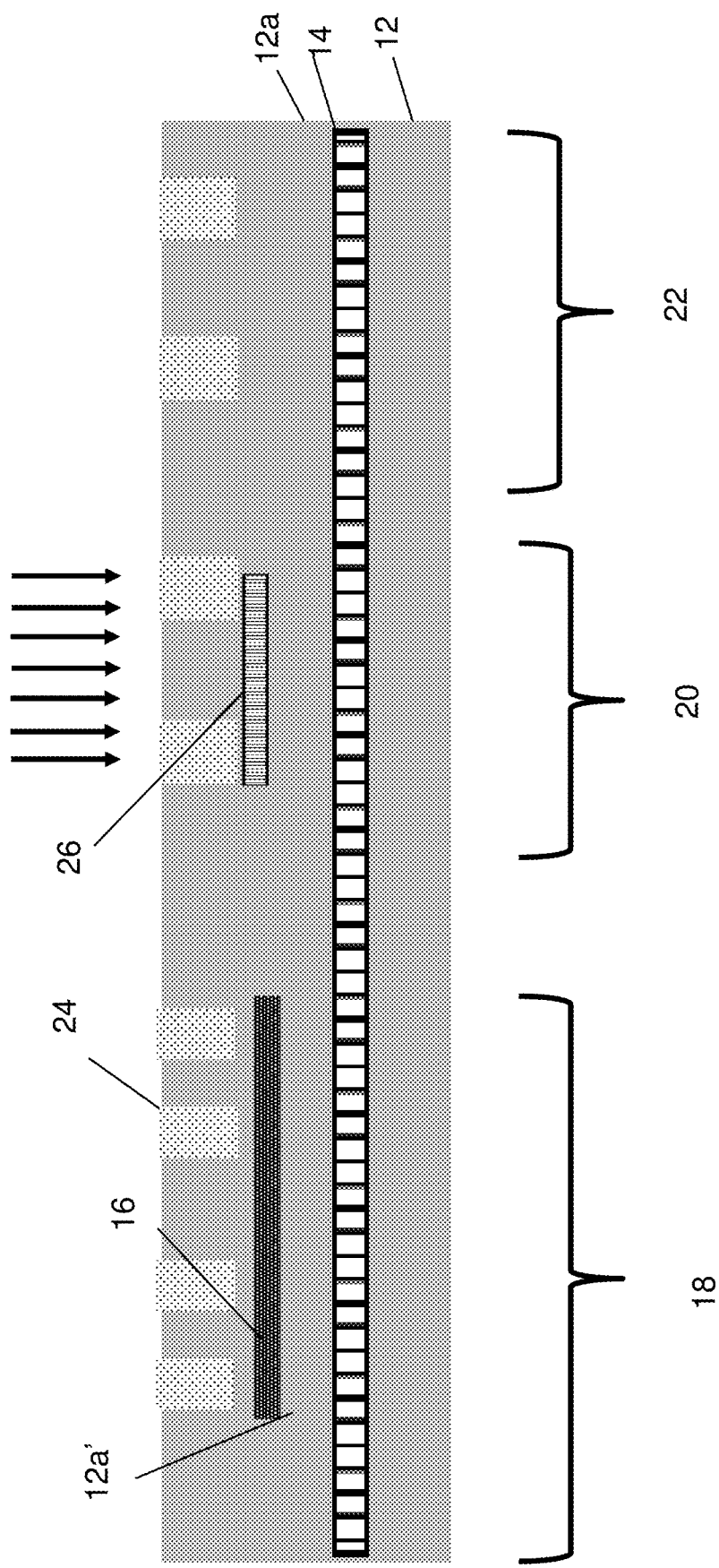
FIG. 3 shows shallow trench isolation structures above the trap rich isolation region, amongst other features, and respective fabrication processes in accordance with aspects of the present disclosure.

FIG. 3 shows shallow trench isolation structures, amongst other features, and respective fabrication processes. More specifically, shallow trench isolation structures 24 are formed in the substrate 12a, over the sub-collector region 16 in the HBT region 18. As shown, the sub-collector region 16 can be vertically below and does not contact the shallow trench isolation structures 24. In embodiments, it is possible to have the shallow trench isolation structures 24 touching the sub-collector region 16. In addition, the shallow trench isolation structures 24 can be separated from and not contacting the trap rich isolation region 14. The shallow trench isolation structures 24 can also be formed in a device region 20, e.g., switch FET and LNA, and device region 22, e.g., logic FETs.

The shallow trench isolation structures 24 can be formed by conventional lithography, etching and deposition methods known to those of skill in the art. For example, a resist formed over the epitaxial substrate material 12a is exposed to energy (light) to form a pattern (opening). An etching process with a selective chemistry, e.g., reactive ion etching (RIE), can be used to form one or more trenches in the epitaxial substrate material 12a through the openings of the resist. Following resist removal by a conventional oxygen ashing process or other known stripants, insulator material, e.g., SiO$_2$, can be deposited by any conventional deposition processes, e.g., chemical vapor deposition (CVD). Any residual insulator material on the surface of the epitaxial substrate material 12a can be removed by conventional chemical mechanical polishing (CMP) processes.

Still referring to FIG. 3, an additional trap rich isolation region 26 can be formed under and in contact with the shallow trench isolation structures 24 in the device region 20, e.g., below the wells of a switch FET. As shown, the additional trap rich isolation region 26 can be separated from the trap rich isolation region 14 by the epitaxial substrate material 12a, e.g., single crystalline Si material. In embodiments, the additional trap rich isolation region 26 can be formed prior to or after formation of the shallow trench isolation structure(s).

The additional trap rich isolation region 26 can be formed using an implantation mask to define selected areas exposed for the implantation of the additional trap rich isolation region 26. For example, in this implantation process, a patterned implantation mask can be used to block the device regions 18, 22 to ensure that regions 18, 22 are not subjected to another implantation process. Following the implantation process, an anneal process recrystallizes the epitaxial substrate material 12a in the device region 20. For example, the anneal may be a rapid thermal anneal (RTA) performed with a peak temperature in a range of 860° C. to 1125° C. with a dwell time at the peak temperature of 34 milliseconds to 60 seconds and, in a particular, the peak temperature may be 1000° C. held for a dwell time of 5 seconds. In this way, the device region 20, e.g., region for a switch FET, includes two trap rich isolation regions 14, 26; whereas, the HBT region 18 and the device region 22 (e.g., for logic FET) only includes a single trap rich isolation region 14.

Figure 4:
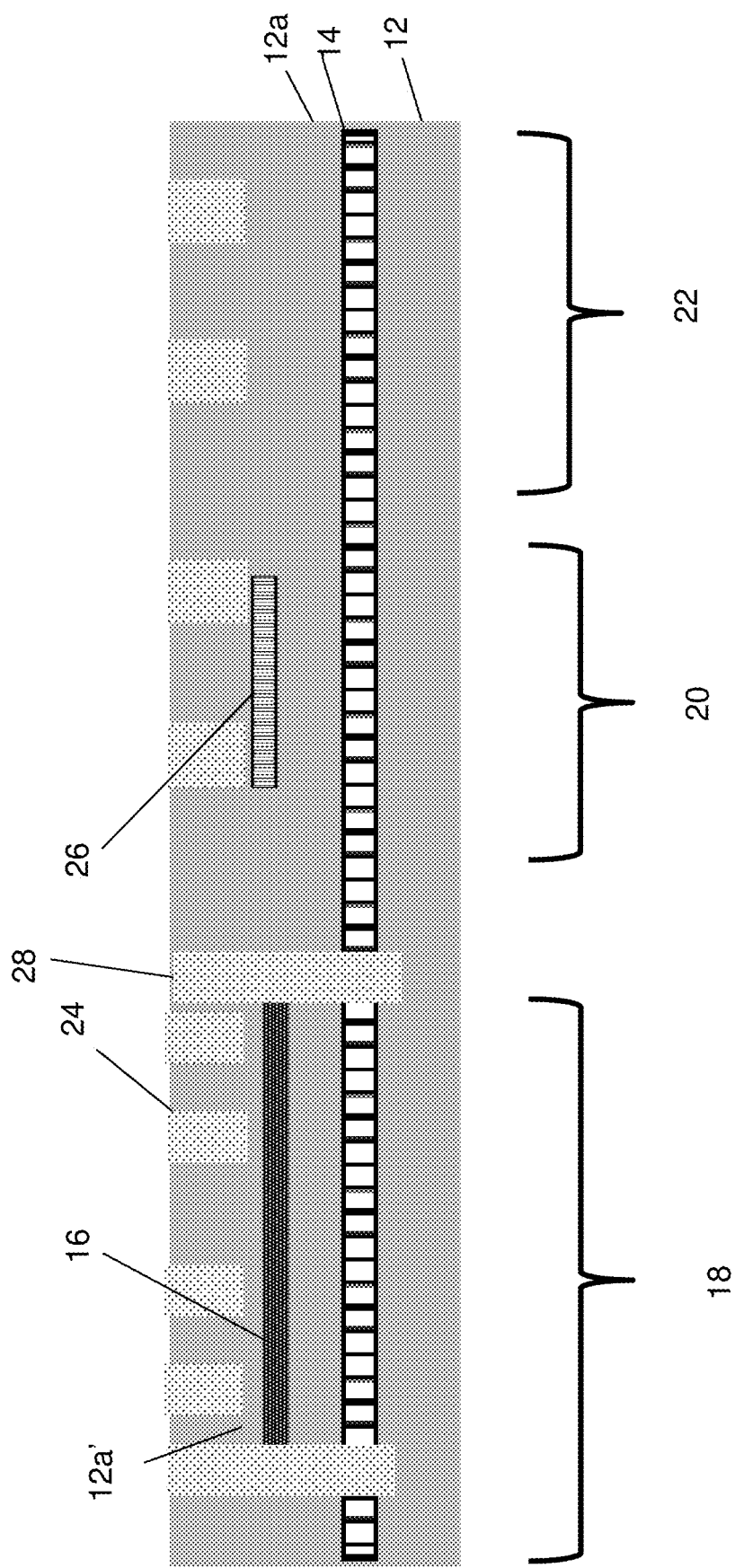
FIG. 4 shows an optional deep trench isolation structure in a HBT region, amongst other features, and respective fabrication processes in accordance with aspects of the present disclosure.

FIG. 4 shows optional deep trench isolation structures 28 extending to and contacting the trap rich isolation region 14 in the HBT region 18. In more specific embodiments, the deep trench isolation structures 28 encapsulate the heterojunction bipolar transistor, contact the trap rich isolation region 14 and extend into the underlying substrate 12 to provide additional isolation of the HBT device, e.g., isolating or surrounding the sub-collector region 16. The optional deep trench isolation structures 28 can be fabricated using conventional lithography, etching and deposition methods known to those of skill in the art as already described herein.

Figure 5:
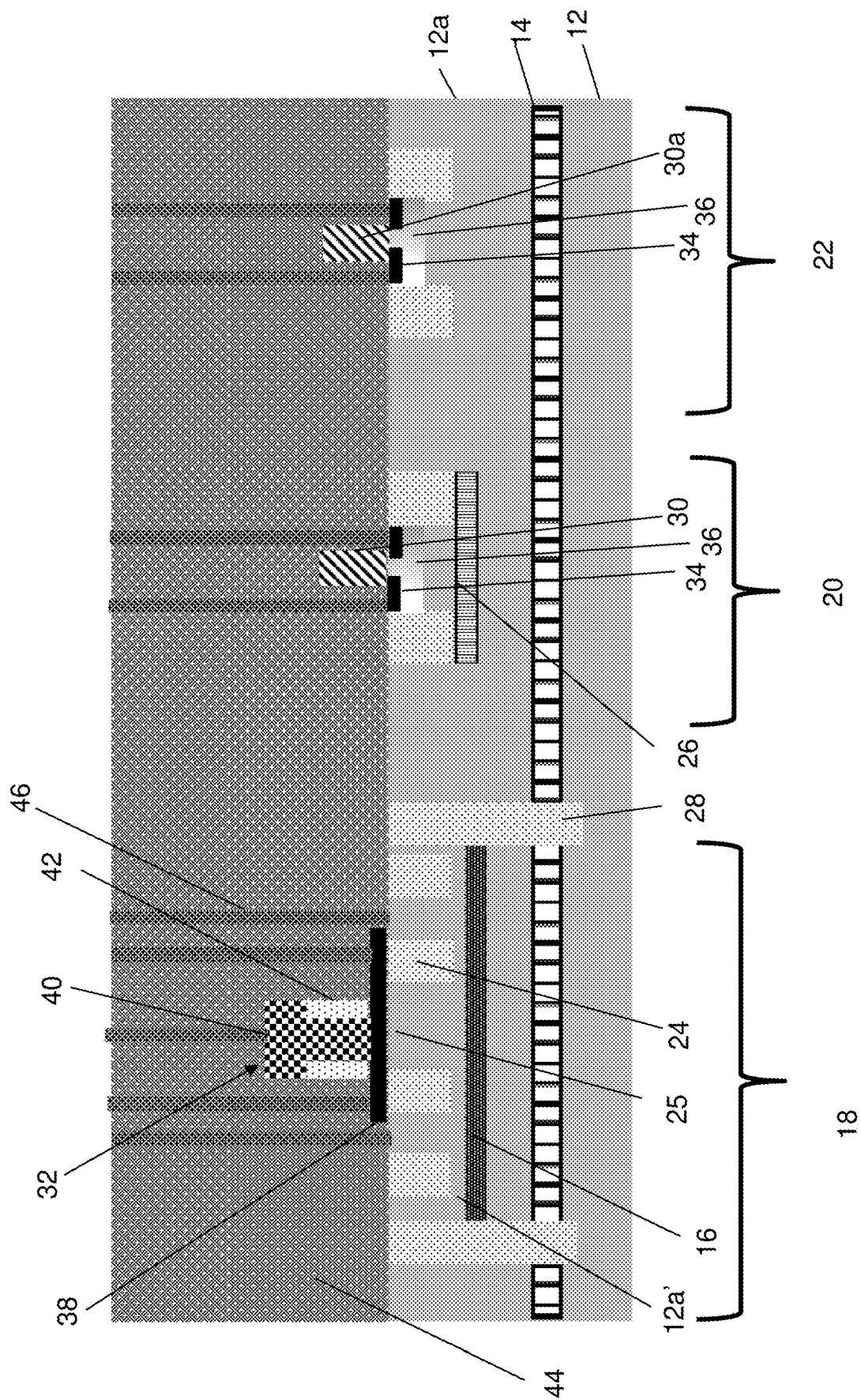
FIG. 5 shows devices above the trap rich isolation region, amongst other features, and respective fabrication processes in accordance with aspects of the present disclosure.

FIG. 5 shows devices above the trap rich isolation region(s), amongst other features, and respective fabrication processes. For example, the device regions 20, 22 each include a transistor 30, 30a, respectively; whereas, the HBT region 18 includes a bipolar heterojunction transistor 32. As previously noted, the transistor 30 can be a switch or LNA and the transistor 30a can be a logic transistor. The bipolar heterojunction transistor 32 can be a SiGe power amplifier, as an example.

Referring to regions 20, 22, the transistors (e.g., FETs) 30, 30a each include source/drain regions 34 formed in a N-well 36. As shown, the source/drain regions 34 and the N-well 36 can be isolated by the shallow trench isolation structures 22 and the trap rich isolation region 26. Also, the N-well 36 does not contact the trap rich isolation region 26.

The transistors 30, 30a can be formed using conventional gate formation processes, e.g., gate first processes or replacement gate processes. For example, in the gate first processes, a gate dielectric material and workfunction material(s) are deposited and patterned using conventional CMOS fabrication process as is known in the art such that no further explanation is required for a complete understanding of the present disclosure. The gate dielectric material can be a high-k gate dielectric material, e.g., $HfO_2$. Examples of the workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. The workfunction materials may be deposited by chemical vapor deposition (CVD), physical vapor deposition (PVD) including sputtering, atomic layer deposition (ALD) or other suitable method.

A sidewall material, e.g. oxide or nitride, can be formed on the patterned gate dielectric material and workfunction materials using conventional deposition processes followed by an anisotropic etching process. Source and drain regions 34 and the N-well 36 can be formed by conventional ion implantation processes, as an example. In alternative examples, the source and drain regions 34 can be raised source and drain regions formed by a doped epitaxial process.

In the HBT region 18, the bipolar heterojunction transistor 32 includes a base region 38 and an emitter region 40. The base region 38 can be composed of doped SiGe material as an example. In embodiments, the dopant of the doped SiGe material can be a p-type dopant, e.g., Boron (B). The base region 38 can be deposited by a conventional CVD process, followed by conventional lithography and etching (e.g., patterning) processes. The base region 38 is provided over the sub-collector region 16 and in contact with the epitaxial substrate material 12a.

The emitter region 40 can be doped Si material, as an example. In embodiments, the dopant can be a n-type dopant, e.g., Arsenic (As), Phosphorus (P) and Sb, among other suitable examples. The emitter region 40 can be deposited by a conventional CVD process, followed by conventional lithography and etching (e.g., patterning) processes. Sidewalls 42 are formed on the emitter region, e.g., oxide material, as is known in the art.

Following the formation of the devices in regions 18, 20, 22, a silicide process can be provided to form contacts to the appropriate active regions, e.g., source/drain regions 34, base region 38, emitter region 40 and collector region 25, e.g., substrate material 12a over the sub-collector region 16. As should be understood by those of skill in the art, the silicide process begins with deposition of a thin transition metal layer, e.g., nickel, cobalt or titanium, over fully formed and patterned devices. After deposition of the material, the structure can be heated allowing the transition metal to react with exposed silicon (or other semiconductor material as described herein) in the active regions of the semiconductor device (e.g., source, drain, etc.) forming a low-resistance transition metal silicide. Following the reaction, any remaining transition metal can be removed by chemical etching, leaving silicide contacts in the active regions of the device.

An interlevel dielectric material 44 can be deposited over the devices, with contacts 46 formed to the silicide contacts of the e.g., source/drain regions 34, base region 38, emitter region 40 and collector region. The interlevel dielectric material 44 can be an oxide material deposited by a CVD process. The contacts 46 can be metal or metal alloy material, preferably composed of tungsten. The contacts 46 can be formed by conventional lithography and etching processes through the interlevel dielectric material 44 to form trenches, followed by deposition of conductive material within the trenches. Any residual material on the interlevel dielectric material 44 can be removed by a CMP process.

Figure 6:
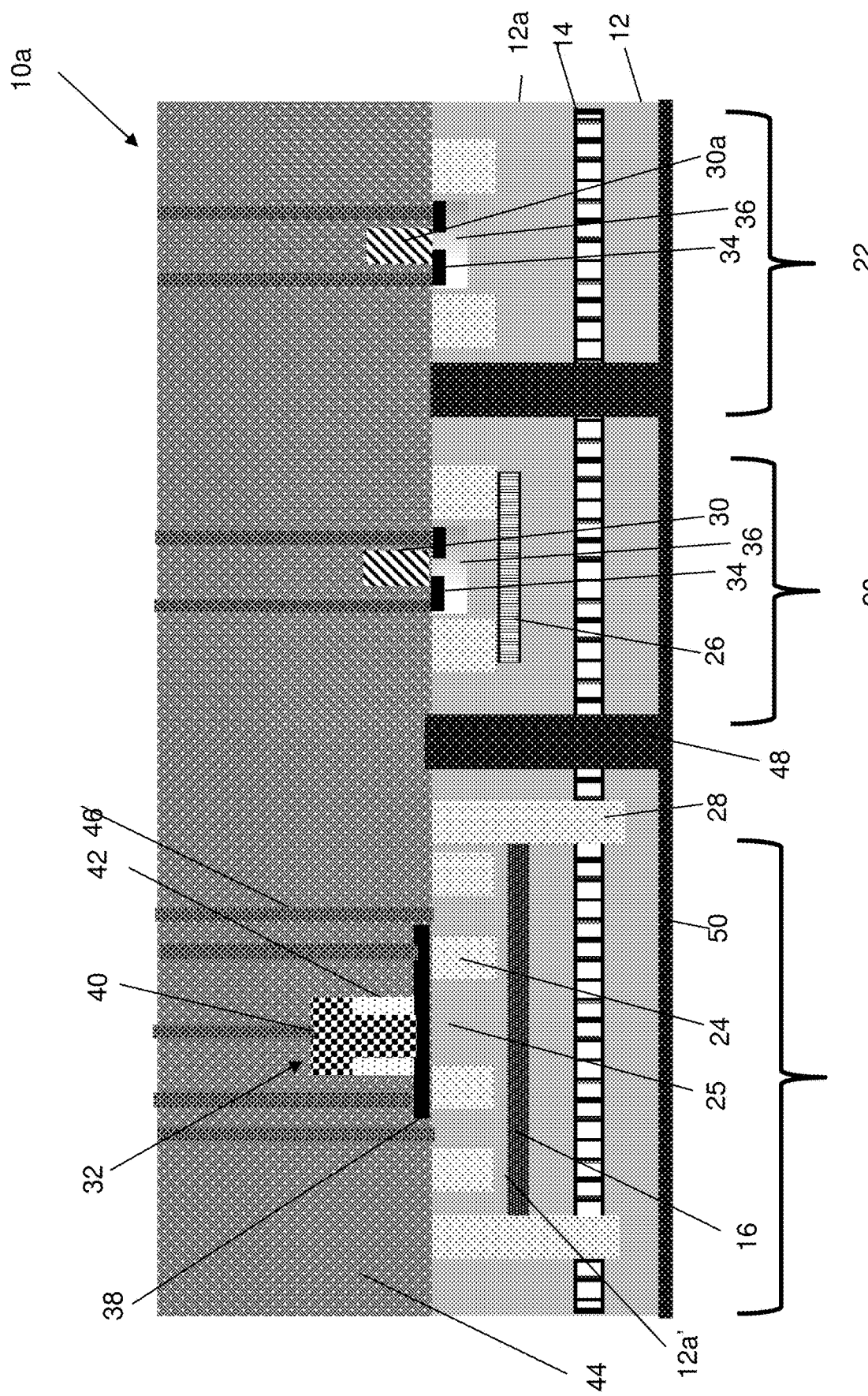
FIG. 6 shows a structure with a grounded through silicon via, amongst other features, and respective fabrication processes in accordance with aspects of the present disclosure.

FIG. 6 shows a structure 10a with a grounded through silicon via 48 in accordance with additional aspects of the present disclosure. In embodiments, the through silicon via 48 can be composed of tungsten or copper. Also, the through silicon via 48 contacts the trap rich isolation region 14. The grounded through silicon via 48 can be formed by conventional lithography, etching and deposition processes as understood by those of ordinary skill in the art such that no further explanation is required for a complete understanding of the present disclosure. In this and other embodiments, the deep trench isolation structures 26 are optional and may be removed from structure 10a.

The heterojunction bipolar transistor (and other devices disclosed herein) can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   an isolation region comprising polycrystalline semiconductor material and embedded within a single crystalline substrate;
   a heterojunction bipolar transistor above the isolation region; and
   a deep trench isolation structure isolating the heterojunction bipolar transistor and contacting the isolation region;
   shallow trench isolation structures within a region defined by the deep trench isolation structure; and
   a sub-collector below the shallow trench isolation structures, above the isolation region and extending to and contacting the deep trench isolation structure.

2. The structure of claim 1, wherein the heterojunction bipolar transistor includes the sub-collector region in the single crystalline substrate, and the heterojunction bipolar transistor is vertically separated from the isolation region by the single crystalline substrate.

3. The structure of claim 1, further comprising:
   a device isolated from the heterojunction bipolar transistor; and
   an additional isolation region comprising polycrystalline semiconductor material contacting shallow trench isolation structures below a well of the device, the additional isolation region being vertical above the isolation region and separated from the well of the device.

4. The structure of claim 3, wherein the device is one of a switch field effect transistor and a low noise amplifier.

5. The structure of claim 3, further comprising a logic transistor above the isolation region.

6. The structure of claim 1, further comprising grounded vias extending through and contacting the isolation region.

7. The structure of claim 1, wherein the single crystalline substrate comprises single crystalline Si material and the isolation region comprises damaged single crystalline Si material.

8. The structure of claim 1, wherein the polycrystalline semiconductor material comprises a trap rich isolation region.

9. The structure of claim 8, wherein the single crystalline substrate comprises epitaxial substrate material over the trap rich isolation region.

10. The structure of claim 2, wherein the sub-collector region comprises an N-type implant.

11. The structure of claim 10, further comprising an intrinsic substate material between the sub-collector region and the polycrystalline semiconductor material.

12. The structure of claim 11, wherein the sub-collector region is vertically above and does not contact the polycrystalline semiconductor material.

13. The structure of claim 2, further comprising shallow trench isolation structures over the sub-collector region.

14. A structure comprising:
    an isolation region comprising polycrystalline semiconductor material and embedded within a single crystalline substrate;
    a heterojunction bipolar transistor above the isolation region; and
    a deep trench isolation structure isolating the heterojunction bipolar transistor and contacting the isolation region; and
    shallow trench isolation structures over the sub-collector region, wherein
    the heterojunction bipolar transistor includes a sub-collector region in the single crystalline substrate, and the heterojunction bipolar transistor is vertically separated from the isolation region by the single crystalline substrate, and
    the sub-collector region is vertically below and does not contact the shallow trench isolation structures.

15. The structure of claim 13, wherein the sub-collector region is vertically below and contacts the shallow trench isolation structures.

16. The structure of claim 13, wherein the shallow trench isolation structures are separated from and not contacting the polycrystalline semiconductor material.

17. The structure of claim 1, further comprising a device region adjacent to the heterojunction bipolar transistor, and a silicon thru via separating the device region from the heterojunction bipolar transistor.

18. The structure of claim 1, further comprising a device region adjacent to the heterojunction bipolar transistor, the device region including shallow trench isolation structures which contact a trap rich isolation region under the shallow trench isolation structures.

19. A structure comprising:
- an isolation region comprising polycrystalline semiconductor material and embedded within a single crystalline substrate;
- a heterojunction bipolar transistor above the isolation region;
- a deep trench isolation structure isolating the heterojunction bipolar transistor and contacting the isolation region; and
- a device region adjacent to the heterojunction bipolar transistor, the device region including shallow trench isolation structures which contact a trap rich isolation region under the shallow trench isolation structures, wherein the additional trap rich isolation region under and in contact with the shallow trench isolation structures is separated from and does not contact the isolation region.

20. The structure of claim 1, wherein the deep trench isolation structure extends through the isolation region to the single crystalline substrate below the isolation region.

\* \* \* \* \*